US011606000B2

(12) United States Patent
Hamada

(10) Patent No.: US 11,606,000 B2
(45) Date of Patent: Mar. 14, 2023

(54) ELECTRIC DRIVE DEVICE AND ELECTRIC POWER STEERING DEVICE

(71) Applicant: HITACHI AUTOMOTIVE SYSTEMS, LTD., Hitachinaka (JP)

(72) Inventor: Keiji Hamada, Hitachinaka (JP)

(73) Assignee: HITACHI ASTEMO, LTD., Hitachinaka (JP)

( * ) Notice: Subject to any disclaimer, the term of this patent is extended or adjusted under 35 U.S.C. 154(b) by 188 days.

(21) Appl. No.: 16/757,809

(22) PCT Filed: Sep. 7, 2018

(86) PCT No.: PCT/JP2018/033145
§ 371 (c)(1),
(2) Date: Apr. 21, 2020

(87) PCT Pub. No.: WO2019/082522
PCT Pub. Date: May 2, 2019

(65) Prior Publication Data
US 2021/0226507 A1     Jul. 22, 2021

(30) Foreign Application Priority Data
Oct. 27, 2017   (JP) .............................. JP2017-207771

(51) Int. Cl.
*H02K 5/22* (2006.01)
*B62D 5/04* (2006.01)
(Continued)

(52) U.S. Cl.
CPC ........... *H02K 5/225* (2013.01); *B62D 5/0406* (2013.01); *B62D 5/0424* (2013.01);
(Continued)

(58) Field of Classification Search
CPC .......... H02K 5/225; H02K 5/06; H02K 11/33; H02K 2211/03; H02K 2213/06;
(Continued)

(56) References Cited

U.S. PATENT DOCUMENTS 6,249,068 B1 * 6/2001 Knopp ................... H02K 5/225
310/67 R
10,668,944 B2 * 6/2020 Fujimoto ............... B62D 5/046
(Continued)

FOREIGN PATENT DOCUMENTS

CN          106605336 A      4/2017
EP          3 200 286 A1     8/2017
(Continued)

OTHER PUBLICATIONS

International Search Report with English translation issued in corresponding application No. PCT/JP2018/033145 dated Oct. 23, 2018.
(Continued)

*Primary Examiner* — John K Kim
(74) *Attorney, Agent, or Firm* — Foley & Lardner LLP

(57) ABSTRACT

A power supplying-side terminal (38) has a power supplying-side hanging portion (38H) extending toward a surface of the circuit board (31), a power supplying-side extending portion (38E) bent from the power supplying-side hanging portion (38H) and extending outwards along the surface of the circuit board (31) and a power supplying-side standing portion (38S) bent from the power supplying-side extending portion (38E) and extending in a direction away from circuit board (31). A power receiving-side terminal (39) has a power receiving-side extending portion (39E) extending outwards along the surface of the circuit board (31) and a power receiving-side standing portion (39S) bent from the power receiving-side extending portion (39E) and extending
(Continued)

in the direction away from circuit board (31). The power supplying-side standing portion (38S) and the power receiving-side standing portion (39S) overlap each other, and connected to each other so as to have electrical continuity.

21 Claims, 11 Drawing Sheets

(51) Int. Cl.
  B62D 6/10      (2006.01)
  H01R 12/57     (2011.01)
  H02K 11/33     (2016.01)
  H02K 5/06      (2006.01)
  H02K 1/18      (2006.01)
  H01R 4/02      (2006.01)
  H05K 1/18      (2006.01)
(52) U.S. Cl.
  CPC ............ *B62D 5/0463* (2013.01); *B62D 6/10* (2013.01); *H01R 12/57* (2013.01); *H02K 5/06* (2013.01); *H02K 11/33* (2016.01); *H05K 1/18* (2013.01); *H01R 4/029* (2013.01); *H02K 2211/03* (2013.01); *H02K 2213/06* (2013.01); *H05K 2201/09163* (2013.01); *H05K 2201/10189* (2013.01); *H05K 2201/10318* (2013.01)
(58) Field of Classification Search
  CPC .. B62D 5/0406; B62D 5/0424; B62D 5/0463; B62D 6/10; H01R 12/57; H01R 4/029; H05K 1/18; H05K 2201/09163; H05K 2201/10189; H05K 2201/10318; H05K 7/1432

USPC ........................................... 310/71
See application file for complete search history.

(56) References Cited

U.S. PATENT DOCUMENTS

| 10,965,181 | B2* | 3/2021 | Hamada | H02K 5/225 |
| 2010/0052449 | A1* | 3/2010 | Hashimoto | B62D 5/0406 |
| | | | | 310/91 |
| 2011/0006625 | A1* | 1/2011 | Fujii | H02K 3/522 |
| | | | | 310/68 B |
| 2012/0160596 | A1* | 6/2012 | Yamasaki | H02K 11/33 |
| | | | | 180/443 |
| 2013/0099609 | A1* | 4/2013 | Ikeno | H02K 11/33 |
| | | | | 310/68 B |
| 2015/0180316 | A1* | 6/2015 | Maeshima | H02K 5/225 |
| | | | | 310/71 |
| 2021/0036574 | A1* | 2/2021 | Hamada | B62D 5/0406 |
| 2021/0226507 | A1* | 7/2021 | Hamada | H01R 12/57 |

FOREIGN PATENT DOCUMENTS

| JP | 2010-063242 A | 3/2010 |
| JP | 2015-134598 A | 7/2015 |
| WO | WO-2016/046898 A1 | 3/2016 |
| WO | WO-2016/075789 A1 | 5/2016 |

OTHER PUBLICATIONS

Written Opinion with English translation issued in corresponding application No. PCT/JP2018/033145 dated Oct. 23, 2018.
The First Office Action dated Oct. 8, 2021 issued in CN Application No. 201880069019.8, with English translation, 20 pages.

* cited by examiner

ELECTRIC DRIVE DEVICE AND ELECTRIC POWER STEERING DEVICE

TECHNICAL FIELD

The present invention relates to an electric drive device and an electric power steering device, and more particularly to an electric drive device and an electric power steering device in which an electronic control device is mounted.

BACKGROUND ART

In a field of general industrial equipment, a mechanical control element is driven by an electric motor. In recent years, so-called electrically mechanically integrated electric drive device, which is configured such that an electronic control unit formed from a semiconductor element etc. controlling a rotation speed and/or a rotation torque of the electric motor is integrally mounted in the electric motor, has been used.

As an example of the electrically mechanically integrated electric drive device, for instance, an electric power steering device is configured such that a turning direction and a turning torque of a steering shaft that turns by driver's operation of a steering wheel are detected, and on the basis of these detection values, the electric motor is driven so as to rotate in the same direction as the turning direction of the steering shaft, then a steering assist torque is generated. To control this electric motor, the power steering device is provided with an electronic control unit.

As a related art electric power steering device, for instance, an electric power steering device disclosed in Japanese Unexamined Patent Application Publication No. 2015-134598 (Patent Document 1) is known. Patent Document 1 discloses the electric power steering device configured by an electric motor unit and an electronic control unit. An electric motor of the electric motor unit is housed in a motor housing having a cylindrical portion made of aluminum alloy etc. A board of the electronic control unit on which electronic elements or components are mounted is fixed to a heat sink that is located at an opposite side to an output shaft of the electric motor in an axial direction of the motor housing and serves as an ECU housing.

The board fixed to the heat sink mounts thereon a power supply circuit unit, a power conversion circuit unit having a power switching element such as a MOSFET and an IGBT that drive and control the electric motor, and a control circuit unit that controls the power switching element. An output terminal of the power switching element and an input terminal of the electric motor are electrically connected through a bus bar.

Power is supplied to the electronic control unit fixed to the heat sink from a power supply through a connector case made of synthetic resin. Further, detection signals concerning an operating state etc. are sent to the electronic control unit from detection sensors. The connector case functions as a lid member or a cover member, and is fixed to an outer peripheral surface of the heat sink with a fixing screw so as to hermetically seal the heat sink.

As another electric drive device in which the electronic control device is integrally mounted, an electric brake and an electric hydraulic pressure controller for various kinds of hydraulic pressure control are known. In the following description, the electric power steering device from among these electric drive devices will be explained.

CITATION LIST

Patent Document

Patent Document 1: Japanese Unexamined Patent Application Publication No. 2015-134598

SUMMARY OF THE INVENTION

Technical Problem

The electric power steering device disclosed in Patent Document 1 is placed in an engine room of the vehicle. Therefore, size reduction in configuration of the electric power steering device is required. In particular, there has been a tendency in recent years for various auxiliary devices such as an exhaust gas control device and a safety precaution device to be disposed in the engine room of the vehicle. It is therefore required for the auxiliary devices including the electric power steering device to be as small as possible. Also, reduction in component count for the electric power steering device is required.

Regarding the electric power steering device, from its structural viewpoint, limit of an axial length of the electric power steering device in a longitudinal direction is not strict, but there is a tendency to limit increase in size of the electric power steering device in the radial direction. Hence, under present circumstances, size reduction of the housing in the radial direction is required. In order to achieve the size reduction in the radial direction, a three-divided configuration in which the power supply circuit unit, the power conversion circuit unit and the control circuit unit are individually divided is effective. With this configuration, since electrical components required to control the electric motor are divided into three, the size reduction in the radial direction can be achieved.

Here, in the electric drive device that is an object of the present invention, as shown in FIGS. 16 and 17, a connector case 50 is located at an outer side in a radial direction with respect to an outer edge 53E of a circuit board 53 of a power supply circuit unit 51. FIG. 16 shows an inside of the connector case 50 viewed from its inside. A connecting portion to supply power from the connector case 50 to the power supply circuit unit 51 is structured as follows. A flat plate portion 52F of a connector case-side terminal (=a power supplying-side terminal) 52 provided at the connector case 50 overlaps a flat plate portion 54F of a substantially U-shaped power supply circuit-side terminal (=a power receiving-side terminal) 54 provided at the circuit board 53 of the power supply circuit unit 51, and top ends of this overlapping portion are joined together by TIG welding then connected through a connecting portion W.

In this manner, the flat plate portion 52F of the connector case-side terminal 52 and the flat plate portion 54F of the power supply circuit-side terminal 54 overlap each other and are joined together. This structure, however, requires an arrangement or a structure in which the power supply circuit-side terminal 54 extends outwards over (or extends across) the outer edge 53E of the circuit board 53 so as to be close to the connector case-side terminal 52. That is, since the flat plate portion 54F of this U-shaped power supply circuit-side terminal 54 is connected to the flat plate portion 52F of the connector case-side terminal 52, the flat plate portion 54F of the power supply circuit-side terminal 54 extends outwards over the outer edge 53E of the circuit board 53 of the power supply circuit unit 51 up to the connector case-side terminal 52.

As mentioned above, the size reduction in the radial direction is required of the electric drive device as the object of the present invention. However, in a case of the structure shown in FIGS. 16 and 17, since the terminal of the connector case 50 is positioned at the outer side with respect to the outer edge 53E of the circuit board 53, as a problem, there is a limit to the size reduction in the radial direction. Here, although the above is explained about the connection between the connector case-side terminal 52 of the connector case 50 and the power supply circuit-side terminal 54 of the power supply circuit unit 51, as a matter of course, an electronic circuit having a similar structure has a same problem, and it is required to deal with this problem.

An object of the present invention is therefore to provide a new electric drive device and a new electric power steering device that are capable of reducing their sizes in the radial direction.

Solution to Problem

The present invention is characterized in that a power supplying-side terminal for supplying power has a power supplying-side hanging portion that extends toward a surface of the circuit board; a power supplying-side extending portion that is bent from the power supplying-side hanging portion and extends outwards along the surface of the circuit board; and a power supplying-side standing portion that is bent from the power supplying-side extending portion and extends in a direction away from the circuit board, and the power receiving-side terminal for receiving power has a power receiving-side extending portion that extends outwards along the surface of the circuit board; and a power receiving-side standing portion that is bent from the power receiving-side extending portion and extends in the direction away from the circuit board, and the power supplying-side standing portion and the power receiving-side standing portion overlap each other, and connected to each other so as to have electrical continuity.

Effects of Invention

According to the present invention, since the power supplying-side terminal is located within a projected area of the circuit board, the size reduction in the radial direction can be possible.

EMBODIMENTS FOR CARRYING OUT THE INVENTION

An embodiment of the present invention will be explained in detail below with reference to the drawings. The present invention is not limited to the following embodiment, and includes all design modifications and equivalents belonging to the technical scope of the present invention.

Figure 1:
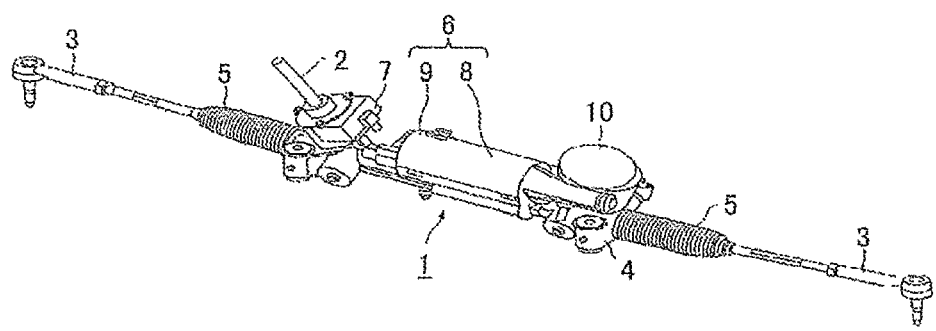
FIG. 1 is a general perspective view of a steering device as an example to which the present invention is applied.

Before explaining the embodiment of the present invention, a configuration of a steering device as an example to which the present invention is applied will be briefly explained using FIG. 1.

First, a steering device to steer front wheels of a vehicle will be explained. A steering device 1 is configured as shown in FIG. 1. A pinion (not shown) is provided at a lower end of a steering shaft 2 connecting to a steering wheel (not shown). This pinion is engaged with a rack (not shown) that extends in right and left directions of a vehicle body. A tie rod 3 to steer the front wheels in the right and left directions is each connected to both ends of the rack. The rack is accommodated in a rack housing 4. Between the rack housing 4 and each tie rod 3, a rubber boot 5 is provided.

The steering device 1 is provided with an electric power steering device 6 to assist torque when performing a turning operation of the steering wheel. That is, a torque sensor 7 that detects a turning direction and a turning torque of the steering shaft 2 is provided. And, an electric motor unit 8 that provides a steering assistive force to the rack via a gear 10 on the basis of a detection value of the torque sensor 7 is provided. Further, an electronic control device (ECU) 9 that controls an electric motor disposed in the electric motor unit 8 is provided. The electric motor unit 8 of the electric power steering device 6 is connected to the gear 10 at three portions of an outer periphery at an output shaft side of the electric motor unit 8 with screws (not shown). The electronic control unit 9 is disposed on an opposite side to the output shaft side of the electric motor unit 8.

In the electric power steering device 6, when the steering shaft 2 is turned in any turning direction by the steering wheel operation, the torque sensor 7 detects the turning direction and the turning torque of the steering shaft 2. A control circuit unit calculates a drive operation amount of the electric motor on the basis of these detection values. The electric motor is then driven by a power switching element of a power conversion circuit unit on the basis of the calculated drive operation amount. And, an output shaft of the electric motor rotates so as to drive and rotate the steering shaft 2 in the same direction as a direction of the steering wheel operation. This rotation of the output shaft of the electric motor is transmitted to the rack (not shown) through the pinion (not shown) and the gear 10, and the vehicle is steered. Since such configuration and workings are well known, a further explanation will be omitted here.

Figure 16:
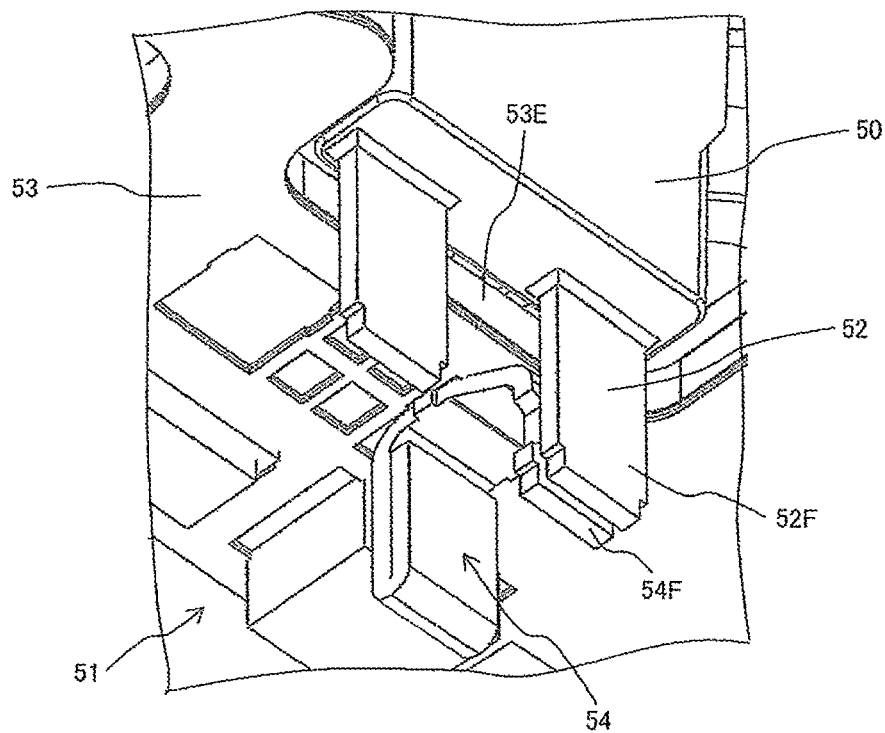
FIG. 16 is an external perspective view showing a structure of a connecting portion of a connector case-side terminal and a power supply circuit-side terminal, according to a related art.
Figure 17:
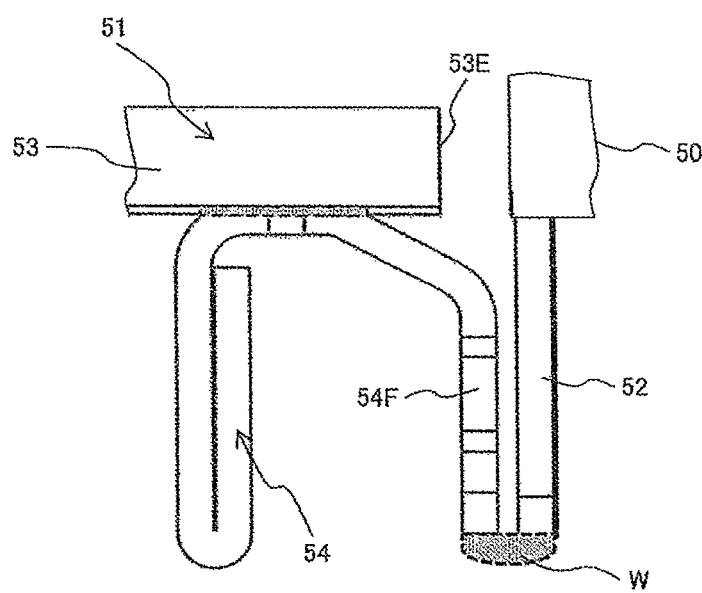
FIG. 17 is a cross section of the connecting portion of the connector case-side terminal and the power supply circuit-side terminal shown in FIG. 16.

As mentioned above, an electric drive device that is an object of the present invention is required to reduce its size in the radial direction. However, in the case of the structure shown in FIGS. 16 and 17, since the terminal of the connector case 50 is positioned at the outer side with respect to the outer edge 53E of the circuit board 53, as a problem, there is a limit to the size reduction in the radial direction.

From such background, the present invention proposes the electric power steering device having the following configuration.

In the present invention, a power supplying-side terminal for supplying power has a power supplying-side hanging portion that extends toward a surface of the circuit board; a power supplying-side extending portion that is bent from the power supplying-side hanging portion and extends outwards along the surface of the circuit board; and a power supplying-side standing portion that is bent from the power supplying-side extending portion and extends in a direction away from the circuit board, and the power receiving-side terminal for receiving power has a power receiving-side extending portion that extends outwards along the surface of the circuit board; and a power receiving-side standing portion that is bent from the power receiving-side extending portion and extends in the direction away from the circuit board, and the power supplying-side standing portion and the power receiving-side standing portion overlap each other, and connected to each other so as to have electrical continuity.

According to the above configuration, since the power supplying-side terminal is located within a projected area of the circuit board, the size reduction in the radial direction can be possible.

In the following description, a configuration of the electric power steering device according to the embodiment of the present invention will be explained in detail with reference to FIGS. 2 to 13.

Figure 2:
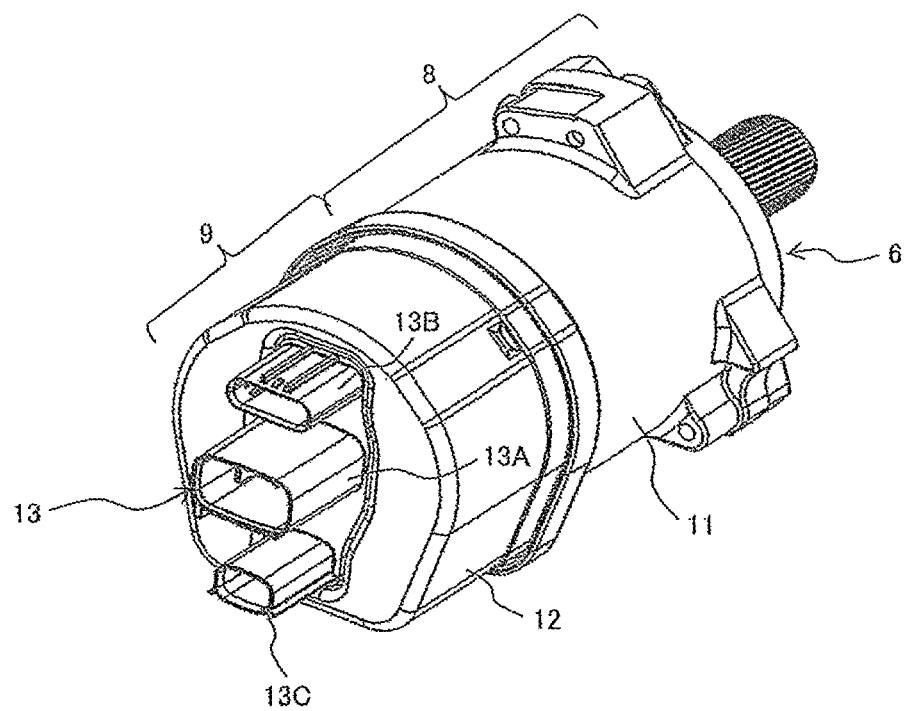
FIG. 2 is a perspective view showing an entire shape of an electric power steering device according to an embodiment of the present invention.

As shown in FIG. 2, an electric motor unit 8 forming the electric power steering device is configured by a motor housing 11 having a cylindrical portion made of aluminum or aluminum-based metal such as aluminum alloy and an electric motor (not shown) accommodated in the motor housing 11. An electronic control unit 9 is configured by a metal cover 12 made of aluminum, aluminum-based metal such as aluminum alloy or iron-based metal and located at an opposite side to an output shaft of the electric motor in an axial direction of the motor housing 11 and an electronic control assembly (not shown) accommodated in this metal cover 12.

The motor housing 11 and the metal cover 12 are fixedly connected to each other at a fixing region that is formed at their opposing end surfaces in an outer circumferential direction by caulking or swaging fixation or welding. The electronic control assembly accommodated inside the metal cover 12 is configured by a power supply circuit unit that generates a required power, a power conversion circuit unit having a power switching element such as a MOSFET and an IGBT that drive and control the electric motor of the electric motor unit 8, and a control circuit unit that controls the power switching element. An output terminal of the power switching element and an input terminal of a coil of the electric motor are electrically connected through a bus bar.

A connector case 13 is exposed from a hole portion formed at an end surface, which is located at an opposite side to the motor housing 11, of the metal cover 12. The connector case 13 is fixed to fixing portions formed at the motor housing 11 with fixing screws. The connector case 13 has a connector terminal forming portion 13A for power supply, a connector terminal forming portion 13B for detection sensors, and a connector terminal forming portion 13C for control state output by which a control state is outputted to an external device.

The electronic control assembly accommodated in the metal cover 12 is supplied with power from a power supply through the synthetic-resin-made connector terminal forming portion 13A for power supply. Further, the electronic control assembly is provided with detection signals of an operating condition etc. from the detection sensors through the connector terminal forming portion 13B for detection sensors. A current control state signal of the electric power steering device is outputted from the electronic control assembly through the connector terminal forming portion 13C for control state output.

Figure 3:
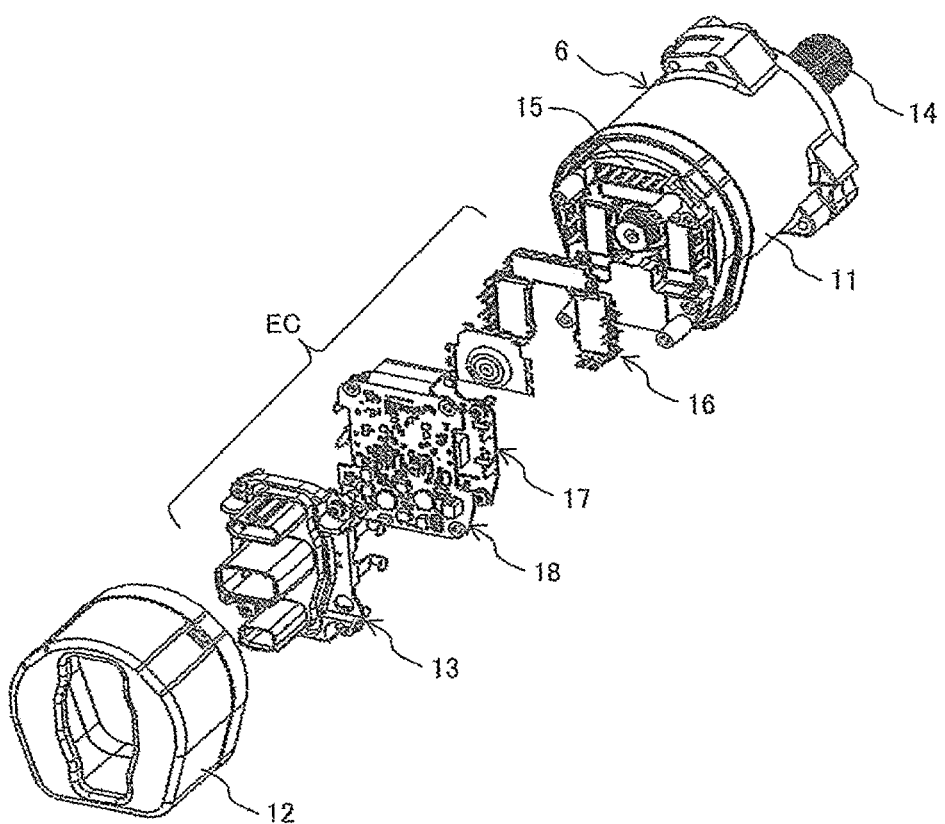
FIG. 3 is a perspective exploded view of the electric power steering device shown in FIG. 2.

FIG. 3 is a perspective exploded view of the electric power steering device 6. An iron-made annular side yoke (not shown) is fitted to an inside of a motor housing 11. The electric motor is accommodated inside this side yoke. An output shaft portion 14 of the electric motor provides the steering assistive force to the rack via the gear. Since a specific structure of the electric motor is well known, its explanation will be omitted here.

The motor housing 11 is made of aluminum alloy, and acts as a heat sink that radiates or releases heat generated at the electric motor and heat generated in after-mentioned power supply circuit unit and power conversion circuit unit to the outside atmosphere. The electric motor and the motor housing 11 form the electric motor unit 8.

An electronic control unit EC is connected to an end surface portion 15 of the motor housing 11 which is an opposite side to the output shaft portion 14 of the electric motor unit 8. The electronic control unit EC has the power conversion circuit unit 16, the power supply circuit unit 17, the control circuit unit 18 and the connector case 13. The end surface portion 15 of the motor housing 11 is formed integrally with the motor housing 11. However, the end surface portion 15 could be formed separately from the motor housing 11, then fixed to the motor housing 11 with screws or by welding.

Here, the power conversion circuit unit 16, the power supply circuit unit 17 and the control circuit unit 18 form a redundant system (a dual-redundancy system) by a main electronic control unit and a sub-electronic control unit. In a normal condition, the electric motor is driven and controlled by the main electronic control unit. However, if an abnormal condition or a failure occurs at the main electronic control unit, the control is switched to the sub-electronic control unit, and the electric motor is driven and controlled by the sub-electronic control unit.

Therefore, normally, heat from the main electronic control unit is transmitted to the motor housing 11. If the abnormal condition or the failure occurs at the main electronic control unit, the main electronic control unit stops and the sub-electronic control unit operates, then heat from the sub-electronic control unit is transmitted to the motor housing 11.

However, both of the main electronic control unit and the sub-electronic control unit could operate as a regular electronic control unit, although the present invention does not apply this configuration. And, if the abnormal condition or the failure occurs at one of the electronic control units, the other electronic control unit drives and controls the electric motor by half ability. In this case, although capability of the electric motor is half, so-called power steering function is secured. Therefore, in the normal condition, heat from the main electronic control unit and the sub-electronic control unit is transmitted to the motor housing 11.

The electronic control unit EC is configured by the power conversion circuit unit 16, the power supply circuit unit 17, the control circuit unit 18 and the connector case 13. These power conversion circuit unit 16, power supply circuit unit 17, control circuit unit 18 and connector case 13 are arranged so as to be stacked in this order from the end surface portion 15 side to a direction moving away from the end surface portion 15. The control circuit unit 18 is a unit that generates a control signal for driving the switching element of the power conversion circuit unit 16, and is configured by a microcomputer and a peripheral circuit and so on. The power supply circuit unit 17 is a unit that generates power to drive the control circuit unit 18 and power for the power conversion circuit unit 16, and is configured by a capacitor, a coil and a switching element and so on. The power conversion circuit unit 16 is a unit that controls power (current) flowing in the coil of the electric motor, and is configured by a switching element that forms three-phase upper and lower arms and so on.

A unit having a large heat value in the electronic control unit EC is mainly the power conversion circuit unit 16 and the power supply circuit unit 17. Heat of the power conversion circuit unit 16 and the power supply circuit unit 17 is released from the motor housing 11 made of aluminum alloy. This detailed structure or configuration will be described with reference to FIGS. 4 to 9 later.

The synthetic-resin-made connector case 13 is arranged between the control circuit unit 18 and the metal cover 12, and is connected to a vehicle battery (the power supply) and other external control device (not shown). Needless to say, the connector case 13 is connected to the power conversion circuit unit 16, the power supply circuit unit 17 and the control circuit unit 18.

The metal cover 12 has a function of accommodating and liquid-tightly sealing the power conversion circuit unit 16, the power supply circuit unit 17 and the control circuit unit 18. In the present embodiment, the metal cover 12 is fixed to the motor housing 11 by the caulking or swaging fixation or with an adhesive.

Figure 4:
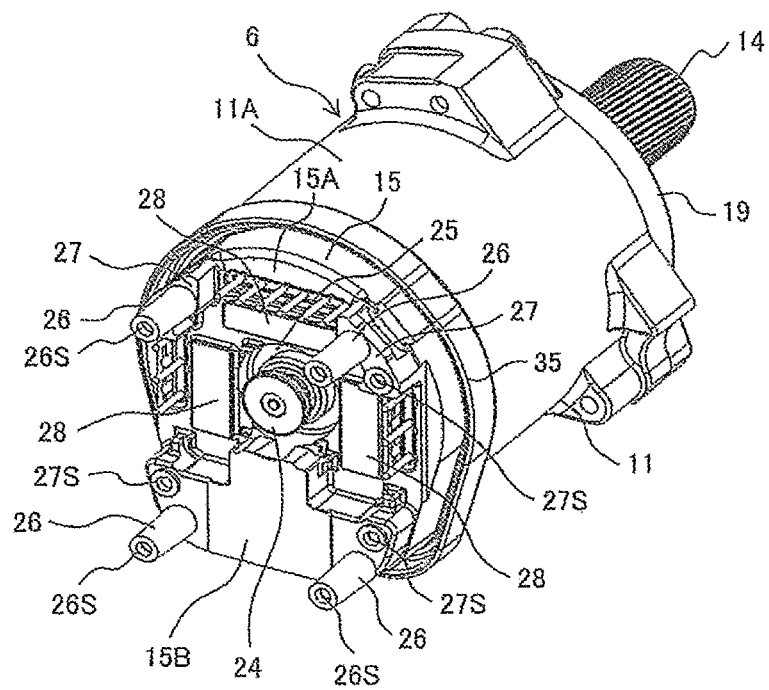
FIG. 4 is a perspective view of a motor housing shown in FIG. 3.
Figure 5:
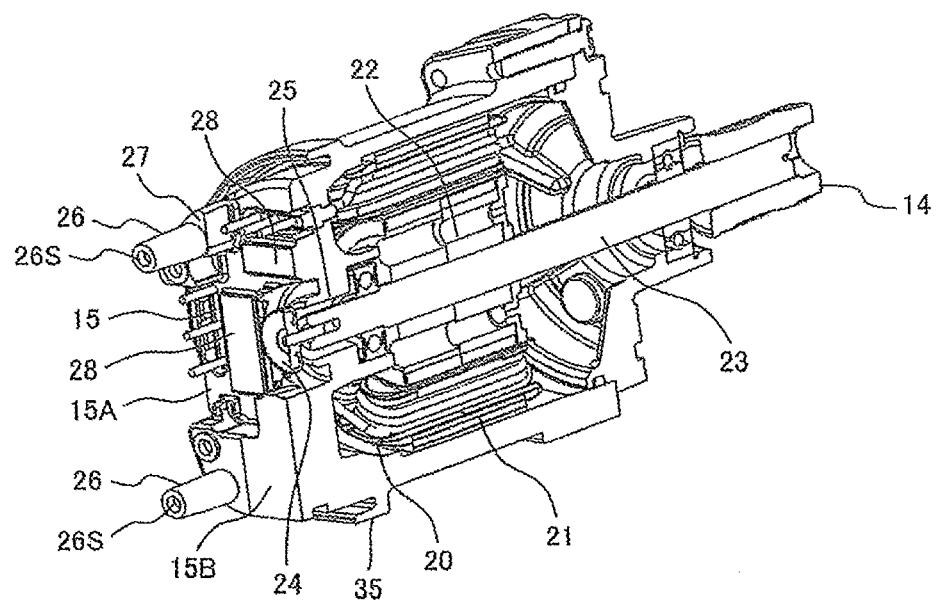
FIG. 5 is a cross section of the motor housing shown in FIG. 4, which is cut in an axial direction of the motor housing.

Next, structure or configuration of each component and an assembling method of the components will be explained with reference to FIGS. 4 to 9. FIG. 4 is an external view of the motor housing 11. FIG. 5 is a cross section of the motor housing 11, which is cut in an axial direction of the motor housing 11.

In FIGS. 4 and 5, the motor housing 11 is shaped into a cylindrical or tubular shape. The motor housing 11 has a side peripheral surface portion 11A, the end surface portion 15 that closes one end of the side peripheral surface portion 11A and an end surface portion 19 that closes the other end of the side peripheral surface portion 11A. In the present embodiment, the side peripheral surface portion 11A and the end surface portion are formed integrally with each other, then the motor housing 11 has a bottomed cylindrical shape. The end surface portion 19 serves as a lid, and closes the other end of the side peripheral surface portion 11A after accommodating the electric motor in the side peripheral surface portion 11A.

Figure 9:
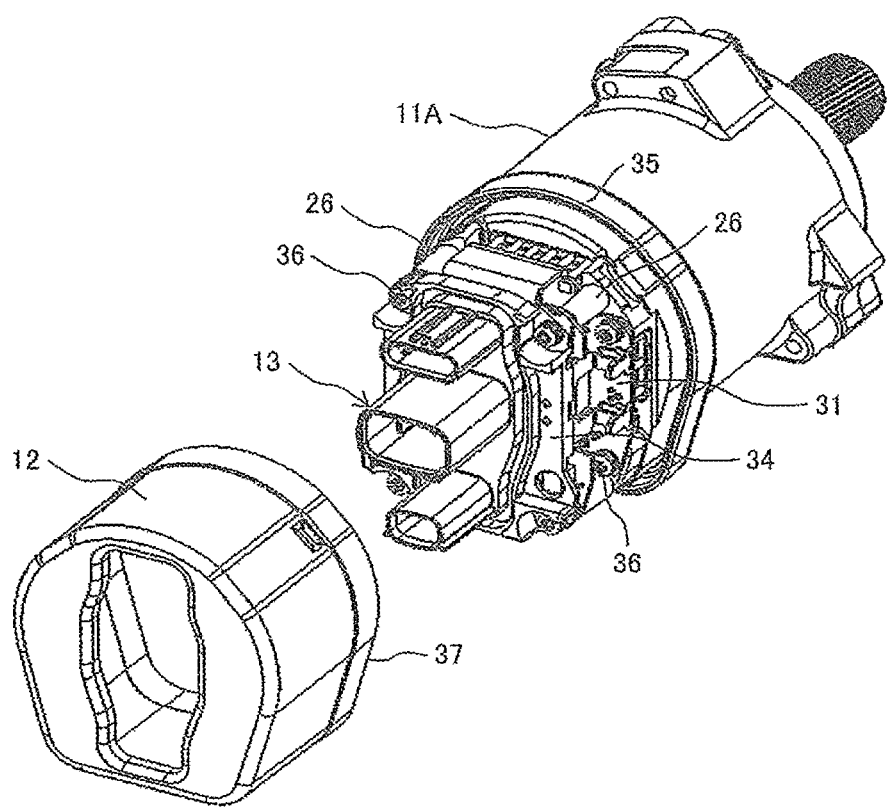
FIG. 9 is a perspective view of the motor housing shown in FIG. 8 with a connector case further mounted on and fixed to the motor housing.

An annular groove portion (hereinafter called a motor housing side annular groove portion) 35 whose diameter is enlarged outwards in a radial direction is formed at an entire circumferential surface of the end surface portion 15. Then, an opening end (hereinafter called a metal cover side annular top end portion) 37 of the metal cover 12 shown in FIG. 9 is engaged with this motor housing side annular groove portion 35. The motor housing side annular groove portion 35 and the metal cover side annular top end portion 37 of the metal cover 12 are liquid-tightly connected together with so-called liquid sealant.

As shown in FIG. 5, a stator 21 having cores around which coils 20 are wound is fitted in the side peripheral surface portion 11A of the motor housing 11, and a rotor 22 in which a permanent magnet is embedded is rotatably accommodated inside this stator 21. A rotation shaft 23 is fixed to the rotor 22, and its one end is the output shaft portion 14, and its other end is a rotation detection portion 24 for detecting a rotation phase and a rotation speed of the rotation shaft 23. The rotation detection portion 24 is provided with a permanent magnet, and protrudes to the outside through a penetration hole 25 formed at the end surface portion 15. The rotation phase and the rotation speed of the rotation shaft 23 are detected by a magnetism detecting portion configured by a GMR element (not shown) etc.

Returning to FIG. 4, heat radiating sections (heat releasing sections) 15A and 15B for the power conversion circuit unit 16 (see FIG. 3) and the power supply circuit unit 17 (see FIG. 3) are formed on a surface of the end surface portion 15 located at an opposite side to the output shaft portion 14 of the rotation shaft 23. Further, board-connector fixing protrusions 26 are formed integrally with the end surface portion 15 at four corners of the end surface portion 15 so as to stand on or protrude from the surface of the end surface portion 15. Each board-connector fixing protrusion 26 has a screw hole 26S inside the board-connector fixing protrusion 26.

The board-connector fixing protrusion 26 is provided to secure an after-mentioned circuit board of the control circuit unit 18 and also the connector case 13. The board-connector fixing protrusions 26 protruding from the power-conversion-circuit heat releasing section 15A (described later) each have a board receiving portion 27 whose height in the axial direction is the same as that of the power-supply-circuit heat releasing section 15B (described later). Each board receiving portion 27 has a screw hole 27S. This board receiving portion 27 is a portion which an after-mentioned glass epoxy circuit board (a circuit board) 31 of the power supply circuit unit 17 is mounted on and fixed to.

A plane area in the radial direction orthogonal to the rotation shaft 23, which forms the end surface portion 15, is sectioned off into two sections. One is the power-conversion-circuit heat releasing section 15A to which the power conversion circuit unit 16 having the power switching element such as the MOSFET is fixed, and the other is the power-supply-circuit heat releasing section 15B to which the power supply circuit unit 17 is fixed. In the present embodiment, an area of the power-conversion-circuit heat releasing section 15A is greater than that of the power-supply-circuit heat releasing section 15B. This is because that the redundant system is employed as described above and a mounting area of the power conversion circuit unit 16 is secured.

And, a different height step in the axial direction (a direction in which the rotation shaft 23 extends) is provided between the power-conversion-circuit heat releasing section 15A and the power-supply-circuit heat releasing section 15B. That is, the power-supply-circuit heat releasing section 15B is formed so as to have a step that is away from the power-conversion-circuit heat releasing section 15A in the direction of the rotation shaft 23 of the electric motor. This step is set to such a height that the power conversion circuit unit 16 and the power supply circuit unit 17 do not interfere with each other when the power supply circuit unit 17 is mounted after the power conversion circuit unit 16 is mounted.

The power-conversion-circuit heat releasing section 15A is provided with three long narrow rectangular protruding heat releasing portions 28. These protruding heat releasing portions 28 are portions on which the power conversion circuit unit 16 for the redundant system is mounted. The protruding heat releasing portions 28 protrude from the surface of the power-conversion-circuit heat releasing section 15A in the direction of the rotation shaft 23 of the electric motor so as to be away from the electric motor.

The power-supply-circuit heat releasing section 15B is formed into a flat surface, and the power supply circuit unit 17 is mounted on the power-supply-circuit heat releasing section 15B. Therefore, the protruding heat releasing portion 28 acts as a heat releasing portion that releases and transmits heat generated at the power conversion circuit unit 16 to the end surface portion 15, and the power-supply-circuit heat releasing section 15B acts as a heat releasing portion that releases and transmits heat generated at the power supply circuit unit 17 to the end surface portion 15.

The protruding heat releasing portions 28 might be removed. In this case, the power-conversion-circuit heat releasing section 15A acts as the heat releasing portion that releases and transmits heat generated at the power conversion circuit unit 16 to the end surface portion 15. In the present embodiment, a metal board of the power conversion circuit unit 16 is welded to the protruding heat releasing portions 28 by frictional stir welding, which securely fixes the metal board to the protruding heat releasing portions 28.

As described above, in the present embodiment, a heat sink member is not needed at the end surface portion of the motor housing 11, then a length in the axial direction can be shortened. Further, since the motor housing 11 has a sufficient heat capacity, it is possible to efficiently radiate or release heat of the power supply circuit unit 17 and the power conversion circuit unit 16 to the outside from the motor housing 11.

Figure 6:
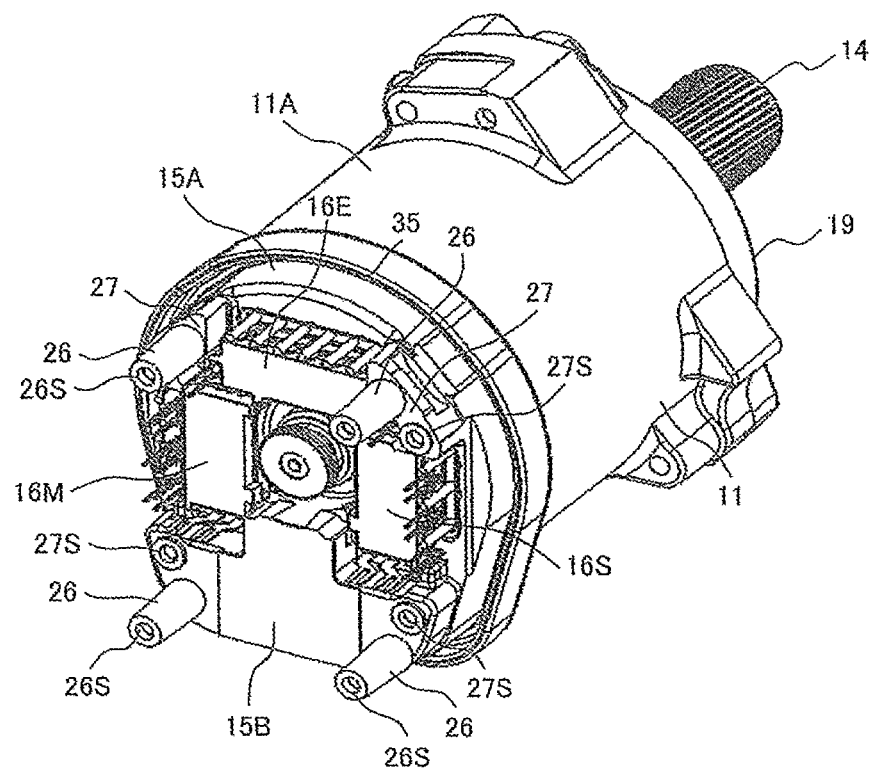
FIG. 6 is a perspective view of the motor housing shown in FIG. 4 with a power conversion circuit unit mounted on and fixed to the motor housing.

Next, FIG. 6 shows a state in which the power conversion circuit unit 16 is mounted on the protruding heat releasing portions 28 (see FIG. 4). As shown in FIG. 6, the power conversion circuit unit 16 forming the redundant system is mounted on the protruding heat releasing portions 28 (see FIG. 4) formed on the power-conversion-circuit heat releasing section 15A. The switching element forming the power conversion circuit unit 16 is mounted on the metal board (using an aluminum-based metal), which is a good heat radiation configuration. The metal board is welded to the protruding heat releasing portions 28 by frictional stir welding.

Thus, the metal board of the power conversion circuit unit 16 is firmly fixed to the protruding heat releasing portions 28, and heat generated at the switching element can be efficiently transmitted to the protruding heat releasing portions 28. Heat transmitted to the protruding heat releasing portions 28 diffuses through the power-conversion-circuit heat releasing section 15A, and is further transmitted to the side peripheral surface portion 11A of the motor housing 11, then is released to the outside. Here, as mentioned above, since a height of the power-conversion-circuit heat releasing section 15A in the axial direction is lower than that of the power-supply-circuit heat releasing section 15B, the power conversion circuit unit 16 does not interfere with the power supply circuit unit 17.

As described above, the power conversion circuit unit 16 is mounted on the protruding heat releasing portions 28 formed on the power-conversion-circuit heat releasing section 15A. Therefore, heat generated at the switching element of the power conversion circuit unit 16 can be efficiently transmitted to the protruding heat releasing portions 28. Heat transmitted to the protruding heat releasing portions 28 diffuses through the power-conversion-circuit heat releasing section 15A, and is further transmitted to the side peripheral surface portion 11A of the motor housing 11, then is released to the outside.

Figure 7:
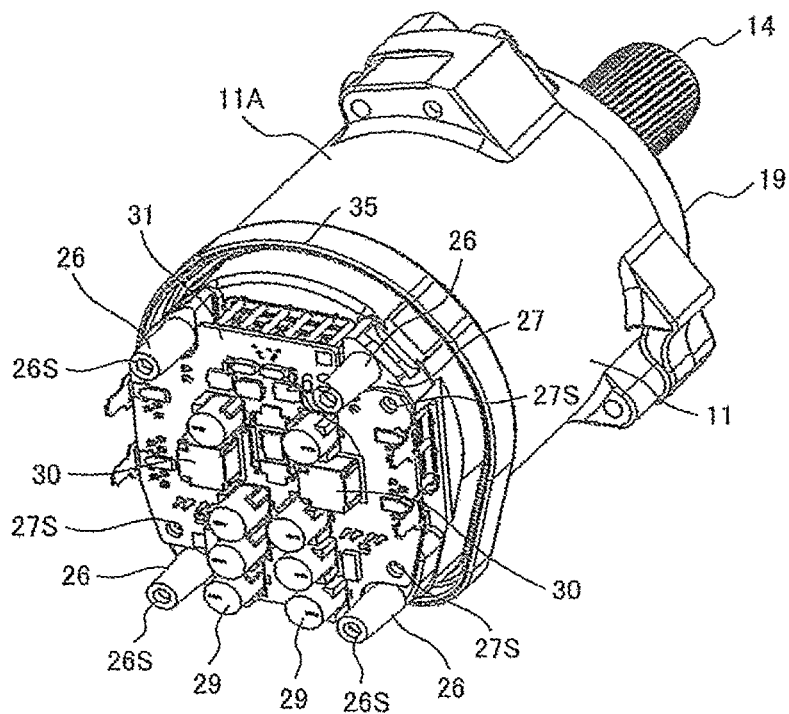
FIG. 7 is a perspective view of the motor housing shown in FIG. 6 with a power supply circuit unit further mounted on and fixed to the motor housing.

Next, FIG. 7 shows a state in which the power supply circuit unit 17 is mounted above or over the power conversion circuit unit 16. As shown in FIG. 7, the power supply circuit unit 17 is mounted on the power-supply-circuit heat releasing section 15B. Capacitors 29 and coils 30 and so on which form the power supply circuit unit 17 are mounted on the glass epoxy circuit board 31. The power supply circuit unit 17 has the redundant system, and as can be seen from the drawings, power supply circuits configured by the capacitors 29 and the coils 30 etc., which are arranged symmetrically with respect to each other, are provided. The glass epoxy circuit board 31 mounts thereon the electric elements such as the capacitors, except the switching element of the power conversion circuit unit 16.

A surface at the power-supply-circuit heat releasing section 15B side (see FIG. 6) of this glass epoxy circuit board 31 is fixed to the end surface portion so as to contact the power-supply-circuit heat releasing section 15B. As a fixing manner, as shown in FIG. 7, the glass epoxy circuit board 31 is fixed to the screw holes 27S provided at the board receiving portions 27 of the board-connector fixing protrusions 26 with fixing screws (not shown), and also fixed to the screw holes 27S provided at the power-supply-circuit heat releasing section 15B (see FIG. 6) with fixing screws (not shown).

Here, since the power supply circuit unit 17 is formed by the glass epoxy circuit board 31, the circuit units could be mounted on both sides of the glass epoxy circuit board 31. On the surface at the power-supply-circuit heat releasing section 15B side of the glass epoxy circuit board 31, the GMR element (not shown) or a rotation phase and rotation speed detection unit that is configured by a detection circuit formed by the GMR element is mounted, and detects the rotation phase and the rotation speed of the rotation shaft 23 (see FIG. 5) in cooperation with the rotation detection portion 24 (see FIG. 5) provided at the rotation shaft 23.

As described above, since the glass epoxy circuit board 31 is fixed to the end surface portion 15 so as to contact the power-supply-circuit heat releasing section 15B, it is possible to efficiently transmit heat generated at the power supply circuit unit 17 to the power-supply-circuit heat releasing section 15B. Heat transmitted to the power-supply-circuit heat releasing section 15B is further transmitted to and diffuses through the side peripheral surface portion 11A of the motor housing 11, then is released to the outside. Here, by interposing one of a good heat transfer adhesive (or a good thermal conductive adhesive), a heat transfer grease (or a thermal conductive grease) and a heat transfer sheet (or a thermal conductive sheet) between the glass epoxy circuit board 31 and the power-supply-circuit heat releasing section 15B, a heat transfer performance (or a thermal conductivity) can be further improved.

As described above, the power supply circuit unit 17 is mounted on the power-supply-circuit heat releasing section 15B. The surface at the power-supply-circuit heat releasing section 15B side of this glass epoxy circuit board 31 on which the circuit elements of the power supply circuit unit 17 are mounted is fixed to the end surface portion 15 so as to contact the power-supply-circuit heat releasing section 15B. It is therefore possible to efficiently transmit heat generated at the power supply circuit unit 17 to the power-supply-circuit heat releasing section 15B. Heat transmitted to the power-supply-circuit heat releasing section 15B is further transmitted to and diffuses through the side peripheral surface portion 11A of the motor housing 11, then is released to the outside.

Figure 8:
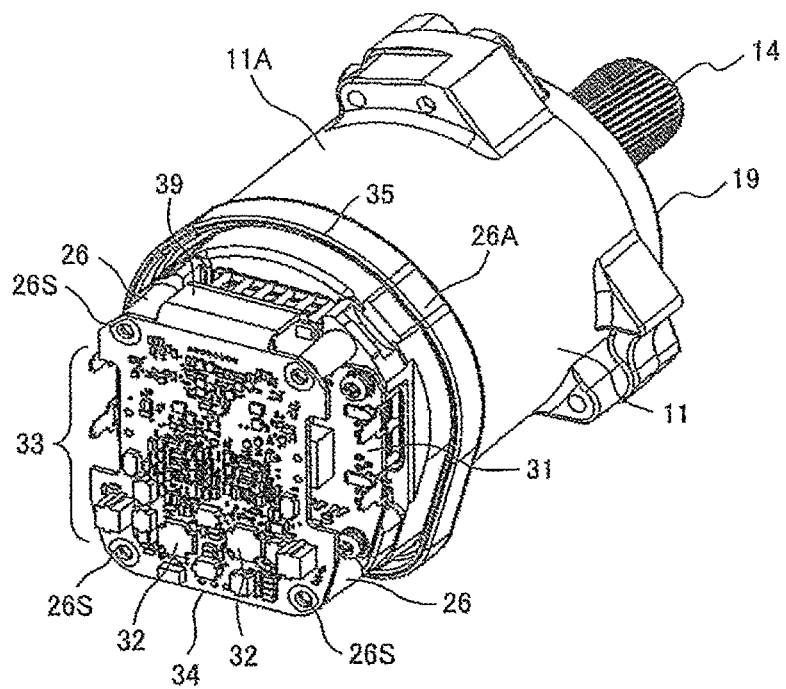
FIG. 8 is a perspective view of the motor housing shown in FIG. 7 with a control circuit unit further mounted on and fixed to the motor housing.

Next, FIG. 8 shows a state in which the control circuit unit 18 is mounted above or over the power supply circuit unit 17. As shown in FIG. 8, the control circuit unit 18 is mounted above or over the power supply circuit unit 17. Microcomputers 32 and peripheral circuits 33 which form the control circuit unit 18 are mounted on the glass epoxy circuit board 34. The control circuit unit 18 also has the redundant system, and as can be seen from the drawings, control circuits configured by the microcomputers 32 and the peripheral circuits 33, which are arranged symmetrically with respect to each other, are provided. The microcomputers 32 and the peripheral circuits 33 could be mounted on a surface at the power supply circuit unit 17 side of the glass epoxy circuit board 34.

This glass epoxy circuit board 34 is fixed to the screw holes 26S provided at tops of the board-connector fixing protrusions 26 (see FIG. 7) with fixing screws (not shown) so as to be sandwiched by the connector case 13, as shown in FIG. 8, then a space in which the capacitors 29 and the coils 30 etc. of the power supply circuit unit 17 shown in FIG. 7 are arranged is provided between the glass epoxy circuit board 31 of the power supply circuit unit 17 and the glass epoxy circuit board 34 of the control circuit unit 18.

Next, FIG. 9 shows a state in which the connector case 13 is mounted above or over the control circuit unit 18. As shown in FIG. 9, the connector case 13 is mounted above or over the control circuit unit 18. The connector case 13 is fixed to the screw holes provided at the tops of board-connector fixing protrusions 26 with fixing screws 36 so as to sandwich the control circuit unit 18 between the power supply circuit unit 17 and the connector case 13. In this state, as shown in FIG. 3, the connector case 13 is connected to the power conversion circuit unit 16, the power supply circuit unit 17 and the control circuit unit 18.

Next, structures of a connector case-side terminal (=a power supplying-side terminal) of the connector case 13 and a power supply circuit-side terminal (=a power receiving-side terminal) of the power supply circuit unit 17, which are structural features of the present embodiment, will be explained with reference to FIGS. 10 to 13 (in the following explanation, a connector case-side refers to a power supplying-side, and a power supply circuit-side refers to a power receiving-side).

Figure 10:
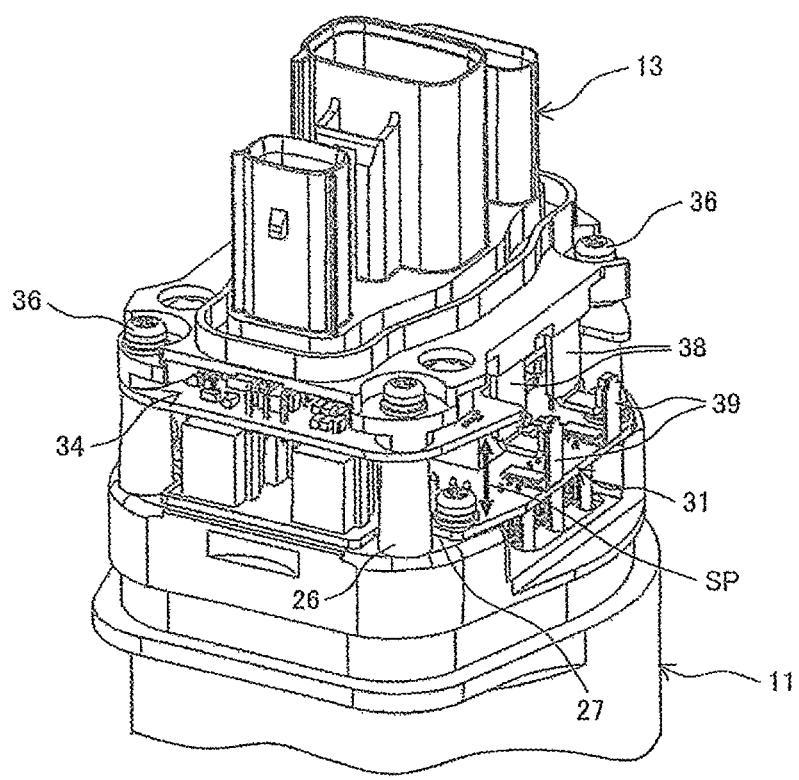
FIG. 10 is an external perspective view showing an arrangement or a configuration of circuit boards and the connector case of the electric power steering device with a metal cover removed, according to an embodiment of the present invention.
Figure 11:
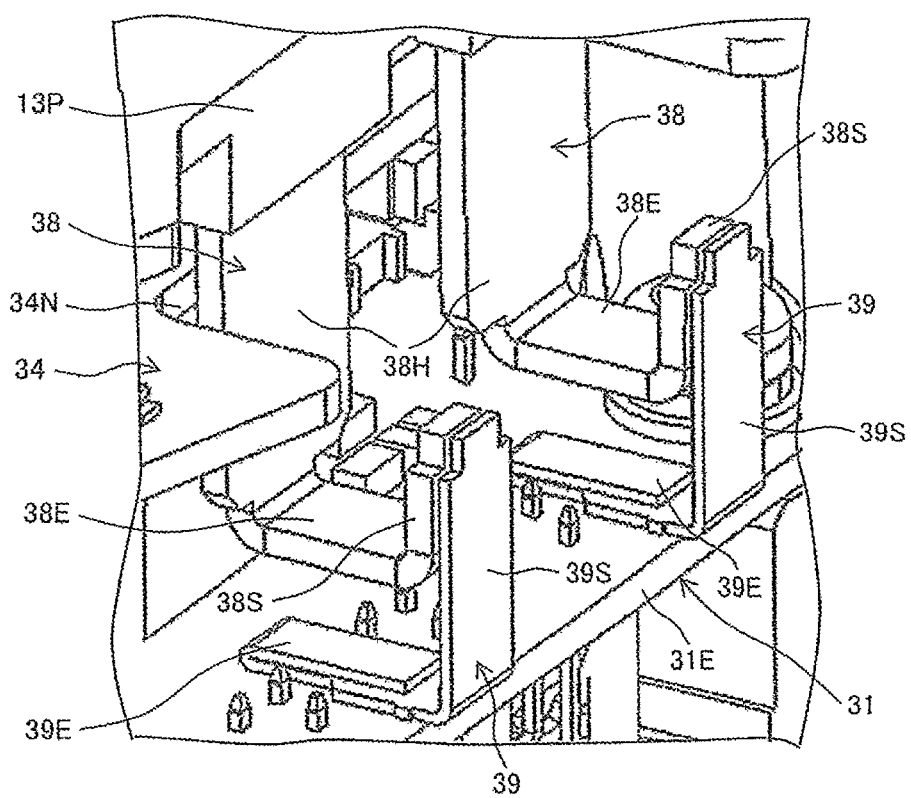
FIG. 11 is an external perspective view showing a structure of a connecting portion of a connector case-side terminal and a power supply circuit-side terminal shown in FIG. 10.

In FIGS. 10 and 11, the glass epoxy circuit board 31 of the power supply circuit unit 17 is fixed to the screw holes 27S provided at the board receiving portions 27 of the board-connector fixing protrusions 26 with the fixing screws 36, and also fixed to the screw holes 27S provided at the power-supply-circuit heat releasing section 15B with the fixing screws. Likewise, the glass epoxy circuit board 34 of the control circuit unit 18 is fixed to the screw holes 26S provided at the board-connector fixing protrusions 26 with fixing screws 36. Further, the connector case 13 is fixed, above or over the glass epoxy circuit board 34, to the screw holes 26S provided at the board-connector fixing protrusions 26 with fixing screws 36.

The connector case 13 is provided with connector case-side terminals 38 that are connected to the vehicle battery (the power supply). The connector case 13 is made of synthetic resin, and the connector case-side terminals 38 are embedded in this synthetic resin by insert molding. The connector case-side terminal 38 is a power supplying-side terminal that supplies power from the vehicle battery (the power supply) to the power supply circuit unit 17. In order to supply large power, the connector case-side terminal 38 has a flat plate terminal shape.

As shown in FIG. 10, each connector case-side terminal 38 penetrates (goes through or passes through) a cutting part 34N formed at the glass epoxy circuit board 34 of the control circuit unit 18, and extends in a space between the glass epoxy circuit board 34 of the control circuit unit 18 and the glass epoxy circuit board 31 of the power supply circuit unit 17. More specifically, each connector case-side terminal 38 extends in a direction orthogonal to a surface of the glass epoxy circuit board 31 of the power supply circuit unit 17, and is located within a projected area of the glass epoxy circuit board 31 of the power supply circuit unit 17. Thus, the cutting part 34N (see FIG. 11) formed at the glass epoxy circuit board 34 of the control circuit unit 18 is also located within the projected area of the glass epoxy circuit board 31 of the power supply circuit unit 17.

Accordingly, since the connector case-side terminals 38 are located within the projected area of the glass epoxy circuit board 31 of the power supply circuit unit 17, the size reduction in the radial direction can be possible. In the case of the structure shown in FIGS. 16 and 17, since the connector case-side terminals are positioned at the outer side in the radial direction with respect to the glass epoxy circuit board of the power supply circuit unit, the size is unnecessarily increased in the radial direction by a distance of this position, which is a problem of the related art. In contrast, in the present embodiment, the connector case-side terminals are not located at the outer side in the radial direction with respect to the glass epoxy circuit board 31 of the power supply circuit unit 17, but located at an inner side in the radial direction with respect to the glass epoxy circuit board 31 of the power supply circuit unit 17, i.e. within the projected area of the glass epoxy circuit board 31 of the power supply circuit unit 17. Therefore, the size is not increased in the radial direction.

As can be seen in FIG. 11, a synthetic resin portion 13P of the connector case 13 is positioned at a connector case side with respect to the glass epoxy circuit board 34 of the control circuit unit 18, and only the metal-made connector case-side terminals 38 penetrate (go through or pass through) the cutting part 34N formed at the glass epoxy circuit board 34 of the control circuit unit 18. With this configuration, there is no need to extend the synthetic resin portion 13P, and an area of the cutting part 34N becomes small, thereby enhancing a mounting-efficiency of electrical components on the glass epoxy circuit board 34 of the control circuit unit 18.

Figure 12:
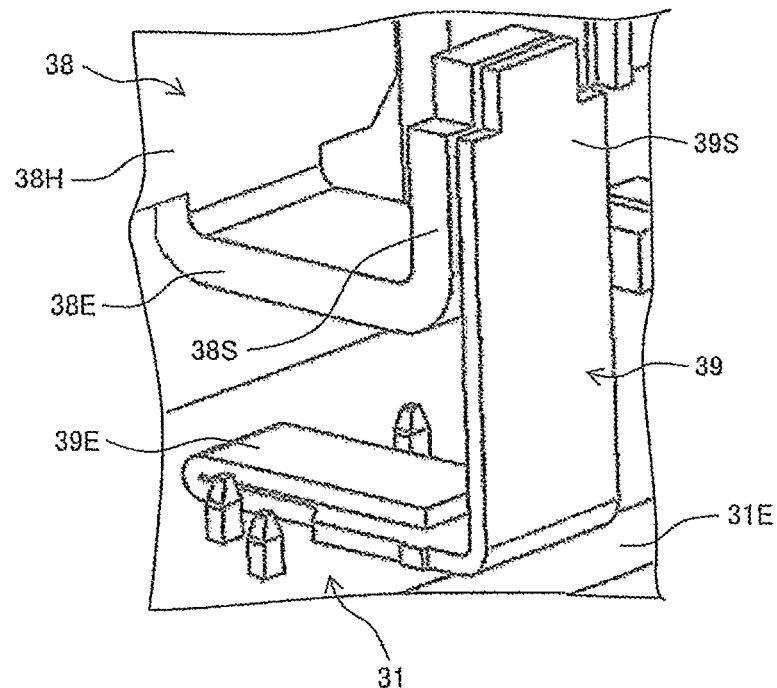
FIG. 12 is an enlarged external perspective view showing the structure of the connecting portion of the connector case-side terminal and the power supply circuit-side terminal shown in FIG. 11.
Figure 13:
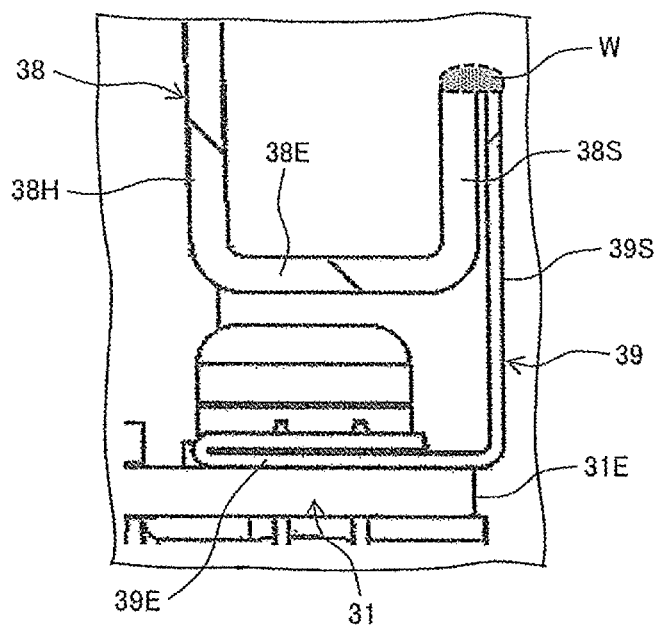
FIG. 13 is a cross section of the connecting portion of the connector case-side terminal and the power supply circuit-side terminal shown in FIG. 12, which is cut in a rotation axis direction.

As shown in FIGS. 11 to 13, the connector case-side terminals 38 have shapes by which the connector case-side terminals 38 are easily connected to respective power supply circuit-side terminals 39 (described later).

That is, each connector case-side terminal 38 for supplying power has a connector case-side hanging portion 38H that extends in a direction orthogonal to the surface of the glass epoxy circuit board 31 of the power supply circuit unit 17. Also, each connector case-side terminal 38 has a connector case-side extending portion 38E that is bent from this connector case-side hanging portion 38H and extends outwards in the radial direction along the surface of the glass epoxy circuit board 31 with a predetermined distance from the surface of the glass epoxy circuit board 31 provided. Further, each connector case-side terminal 38 has a connector case-side standing portion 38S that is bent in a vertical direction from this connector case-side extending portion 38E and extends in a direction away from the glass epoxy circuit board 31.

On the other hand, the power supply circuit-side terminal 39 for receiving power is shaped so as to fit the shape of the connector case-side terminal 38. The power supply circuit-side terminal 39 is a flat plate terminal, and connected to a wiring pattern of the glass epoxy circuit board 31 of the power supply circuit unit 17. Each power supply circuit-side terminal 39 has a power supply circuit-side extending portion 39E that extends outwards in the radial direction along the surface of the glass epoxy circuit board 31 of the power supply circuit unit 17. Also, each power supply circuit-side terminal 39 has a power supply circuit-side standing portion 39S that is bent in the vertical direction from this power supply circuit-side extending portion 39E and extends in the direction away from the glass epoxy circuit board 31.

The connector case-side extending portion 38E of the connector case-side terminal 38 and the power supply circuit-side extending portion 39E of the power supply circuit-side terminal 39 are located within the same projected area. More specifically, the connector case-side extending portion 38E of the connector case-side terminal 38 and the power supply circuit-side extending portion 39E of the power supply circuit-side terminal 39 substantially have shapes and are located so that projected areas of these connector case-side extending portion 38E and power supply circuit-side extending portion 39E overlap each other, when viewed in the axial direction, with a predetermined distance provided between them.

Further, the connector case-side standing portion 38S of the connector case-side terminal 38 and the power supply circuit-side standing portion 39S of the power supply circuit-side terminal 39 overlap each other so as to contact each other, or overlap each other with a slight gap provided between them. Then, top end portions of the connector case-side standing portion 38S and the power supply circuit-side standing portion 39S are welded and joined together by TIG welding, and a connecting portion W having electrical continuity is formed.

In a case of the present embodiment, the connector case-side standing portion 38S of the connector case-side terminal 38 is located at an inner side in the radial direction, and the power supply circuit-side standing portion 39S of the power supply circuit-side terminal 39 is located at an outer side in the radial direction. With this configuration, these connector case-side standing portion 38S and power supply circuit-side standing portion 39S can be connected even in a narrow space. Therefore, as shown in FIG. 13, the connector case-side standing portion 38S of the connector case-side terminal 38 extends in the direction away from the glass epoxy circuit board 31 at a position where the connector case-side standing portion 38S does not extend outwards over (or does not extend across) an outer peripheral edge 31E of the glass epoxy circuit board 31. Further, with this configuration, an outer peripheral edge of the power supply circuit-side standing portion 39S can be set at the substantially same position as the outer peripheral edge 31E of the glass epoxy circuit board 31 of the power supply circuit unit 17. As a consequence, the size reduction in the radial direction can be possible.

As can be understood from FIGS. 12 and 13, the power supply circuit-side extending portion 39E of the power supply circuit-side terminal 39 is bent, and has a folded shape. With this structure, a weight of the power supply circuit-side extending portion 39E is heavier than that of the power supply circuit-side standing portion 39S of the power supply circuit-side terminal 39. Therefore, in a case where the power supply circuit-side terminal 39 is soldered to the glass epoxy circuit board 31 of the power supply circuit unit 17 by a ref low process, good mounting stability of the power supply circuit-side terminal 39 is ensured. Then, even when solder melts in a soldering process, the power supply circuit-side terminal 39 does not fall or tip over. Thus, no special holder or structure for self-standing of the power supply circuit-side terminal 39 is required, thereby increasing productivity.

In addition, since the power supply circuit-side extending portion 39E of the power supply circuit-side terminal 39 has the folded shape by being bent, its length in a thickness direction is substantially double. Therefore, contact areas of the solder adhering to portions between the glass epoxy circuit board 31 and side surfaces of the power supply circuit-side extending portion 39E become large, and a strength that pulls or holds the power supply circuit-side terminal 39 becomes large, thereby improving reliability. Further, since the weight of the power supply circuit-side extending portion 39E is heavier (almost double), the power supply circuit-side terminal 39 can balance even though a length of the power supply circuit-side extending portion 39E to the power supply circuit-side standing portion 39S is short. Since the length of the power supply circuit-side extending portion 39E can be shorter, an occupied area required to mount the power supply circuit-side terminal 39 on the glass epoxy circuit board 31 can be small.

Next, a modified example of the embodiment of the present invention will be explained with reference to FIGS. 14 and 15. The same element or component as that of the above embodiment is denoted by the same reference sign, and its explanation will be omitted. A different point from the above embodiment is as follows. The power supply circuit-side extending portions 39E of the power supply circuit-side terminals 39 are soldered to a surface (for the sake of convenience, referred to as a "B-surface") of the glass epoxy circuit board 31 which is opposite to a surface (for the sake of convenience, referred to as a "A-surface") of the glass epoxy circuit board 31 which faces the connector case-side terminals 38.

Figure 14:
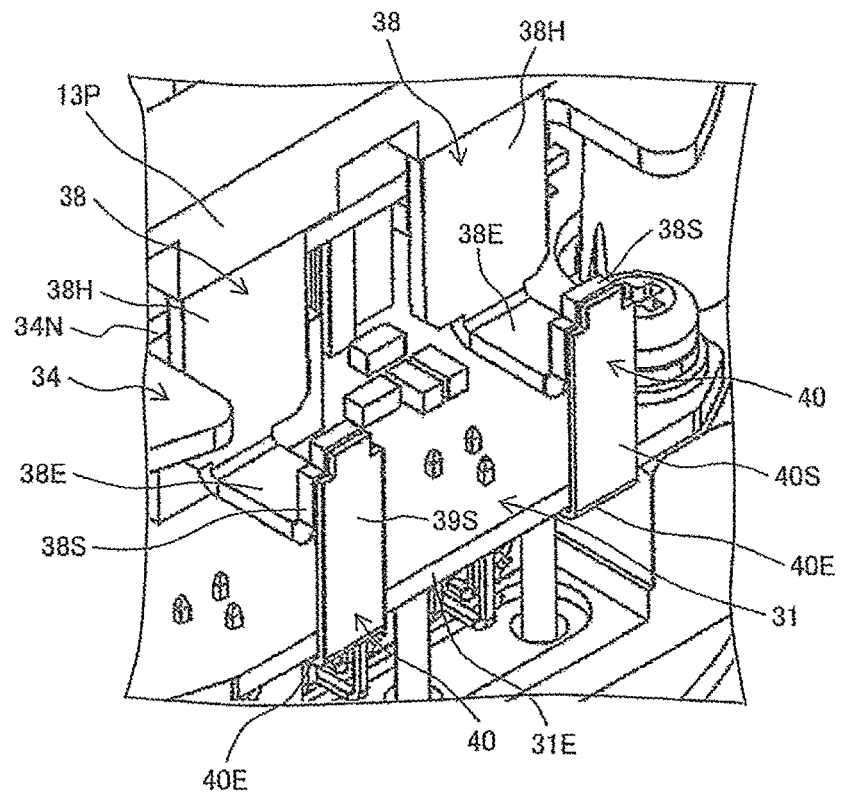
FIG. 14 is an external perspective view showing a structure of a connecting portion of a connector case-side terminal and a power supply circuit-side terminal, according to a modified example of the embodiment of the present invention.
Figure 15:
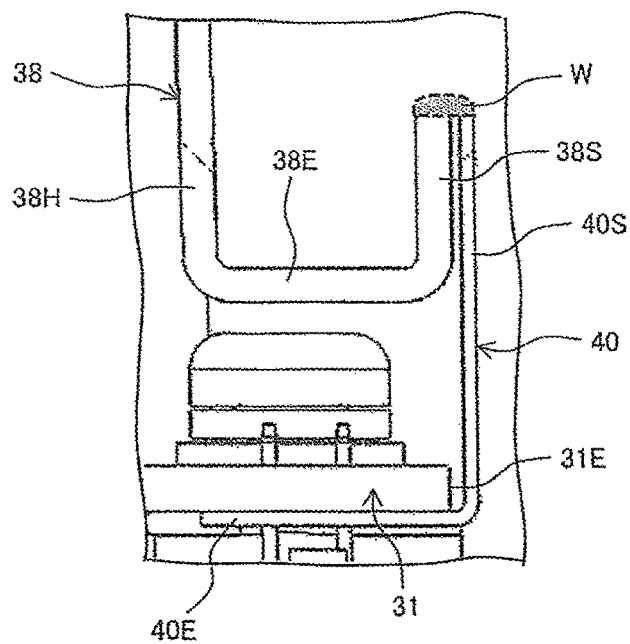
FIG. 15 is an enlarged external perspective view showing the structure of the connecting portion of the connector case-side terminal and the power supply circuit-side terminal shown in FIG. 14.

In FIGS. 14 and 15, power supply circuit-side extending portions 40B of power supply circuit-side terminals 40 are soldered to the B-surface that is opposite to the A-surface of the glass epoxy circuit board 31 which faces the connector case-side terminals 38, and connected to the wiring pattern of the glass epoxy circuit board 31.

Since the structure or configuration of the connector case-side terminal 38 for supplying power is the same as that of the above embodiment, its explanation will be omitted. On the other hand, the power supply circuit-side terminal 40 for receiving power is shaped so as to fit the shape of the connector case-side terminal 38, and its detailed shape is as follows.

The power supply circuit-side terminals 40 are connected to the wiring pattern of the B-surface of the glass epoxy circuit board 31 of the power supply circuit unit 17. Each power supply circuit-side terminal 40 has the power supply circuit-side extending portion 40E that extends outwards in the radial direction along the B-surface of the glass epoxy circuit board 31 of the power supply circuit unit 17. Also, each power supply circuit-side terminal 40 has a power supply circuit-side standing portion 40S that is bent in the vertical direction toward the connector case-side terminal 38 from this power supply circuit-side extending portion 40E at a portion at which the power supply circuit-side extending portion 40E extends over the outer peripheral edge 31E of the glass epoxy circuit board 31 and that extends in the direction away from the glass epoxy circuit board 31.

The connector case-side extending portion 38E of the connector case-side terminal 38 and the power supply circuit-side extending portion 40E of the power supply circuit-side terminal 40 are located within the same projected area. More specifically, the connector case-side extending portion 38E of the connector case-side terminal 38 and the power supply circuit-side extending portion 40E of the power supply circuit-side terminal substantially have shapes and are located so that projected areas of these connector case-side extending portion 38E and power supply circuit-side extending portion 40E overlap each other, when viewed in the axial direction, with a predetermined distance provided between them.

Further, the connector case-side standing portion 38S of the connector case-side terminal 38 and the power supply circuit-side standing portion 40S of the power supply circuit-side terminal 40 overlap each other so as to contact each other, or overlap each other with a slight gap provided between them. Then, top end portions of the connector case-side standing portion 38S and the power supply circuit-side standing portion 40S are welded and joined together by TIG welding, and a connecting portion W having electrical continuity is formed. Furthermore, the connector case-side standing portion 38S of the connector case-side terminal 38 is located at an inner side in the radial direction, and the power supply circuit-side standing portion 40S of the power supply circuit-side terminal 40 is located at an outer side in the radial direction.

The structure or configuration of the modified example can cope with a case where the wiring pattern is provided on the B-surface of the glass epoxy circuit board 31. Further, the connector case-side standing portion 38S of the connector case-side terminal 38 is located at the inner side, and the power supply circuit-side standing portion 40S of the power supply circuit-side terminal 40 is located at the outer side.

With this configuration, these connector case-side standing portion 38S and power supply circuit-side standing portion 40S can be connected even in a narrow space. Therefore, as shown in FIG. 15, an outer peripheral edge of the power supply circuit-side standing portion 40S can be set at the substantially same position as the outer peripheral edge 31E of the glass epoxy circuit board 31 of the power supply circuit unit 17. As a consequence, the size reduction in the radial direction can be possible.

As described above, according to the present invention, the power supplying-side terminal for supplying power has the power supplying-side hanging portion that extends toward the surface of the circuit board; the power supplying-side extending portion that is bent from the power supplying-side hanging portion and extends outwards along the surface of the circuit board; and the power supplying-side standing portion that is bent from the power supplying-side extending portion and extends in the direction away from the circuit board, and the power receiving-side terminal for receiving power has the power receiving-side extending portion that extends outwards along the surface of the circuit board; and the power receiving-side standing portion that is bent from the power receiving-side extending portion and extends in the direction away from the circuit board, and the power supplying-side standing portion and the power receiving-side standing portion overlap each other, and connected to each other so as to have electrical continuity.

According to this configuration, since the power supplying-side terminal is located within the projected area of the circuit board, the size reduction in the radial direction can be possible.

The present invention is not limited to the above embodiment, and includes all design modifications. The above embodiment is an embodiment that is explained in detail to easily understand the present invention, and the present invention is not necessarily limited to the embodiment having all elements or components described above. Further, a part of the configuration of the embodiment can be replaced with a configuration of other embodiments. Also, the configuration of other embodiments could be added to the configuration of the embodiment. Moreover, regarding a part of the configuration of the embodiment, the configuration of other embodiments could be added, removed and replaced.

As an electric drive device based on the above embodiment and modified example, for instance, the followings are raised.

That is, as one aspect of the present invention, an electric drive device comprises: an electric motor driving a mechanical control element; and an electronic control device provided at an opposite side to an output shaft of the electric motor and configured to control the electric motor. The electronic control device has: an ECU housing connected to a motor housing that accommodates therein the electric motor; and an electronic control unit accommodated in the ECU housing and configured to control the electric motor. The electronic control unit has: a power supplying-side terminal structured to supply power; and a power receiving-side terminal structured to receive the power from the power supplying-side terminal for power supply to a circuit unit mounted on a circuit board. The power supplying-side terminal has: a power supplying-side hanging portion that extends toward a surface of the circuit board; a power supplying-side extending portion that is bent from the power supplying-side hanging portion and extends outwards along the surface of the circuit board; and a power supplying-side standing portion that is bent from the power supplying-side extending portion and extends in a direction away from the circuit board. The power receiving-side terminal has: a power receiving-side extending portion that is connected to a wiring pattern of the circuit board and extends outwards along the surface of the circuit board; and a power receiving-side standing portion that is bent from the power receiving-side extending portion and extends in the direction away from the circuit board. The power supplying-side standing portion and the power receiving-side standing portion overlap each other, and connected to each other so as to have electrical continuity.

From another viewpoint, as one aspect of the present invention, an electric drive device comprises: a motor housing accommodating therein an electric motor that drives a mechanical control element; and an electronic control unit provided at an end surface portion side of the motor housing which is an opposite side to an output shaft portion of a rotation shaft of the electric motor, the electronic control unit having a control circuit unit, a power supply circuit unit, a power conversion circuit unit, which are configured to drive the electric motor, and a connector case structured to supply power to the power supply circuit unit. A power-conversion-circuit heat releasing section and a power-supply-circuit heat releasing section are formed at the end surface portion of the motor housing, and the power conversion circuit unit is set on the power-conversion-circuit heat releasing section and the power supply circuit unit is set on the power-supply-circuit heat releasing section. The control circuit unit is mounted on a circuit board for the control circuit unit and the power supply circuit unit is mounted on a circuit board for the power supply circuit unit, and each of the circuit boards is set in a radial direction orthogonal to the rotation shaft of the electric motor so as to be stacked in a direction of the rotation shaft of the electric motor. The connector case has a power supplying-side terminal structured to supply power to the power supply circuit unit, and the power supply circuit unit has a power receiving-side terminal structured to receive the power from the power supplying-side terminal for power supply to the power supply circuit unit mounted on the circuit board for the power supply circuit unit. The power supplying-side terminal has: a power supplying-side hanging portion that extends toward a surface of the circuit board of the power supply circuit unit; a power supplying-side extending portion that is bent from the power supplying-side hanging portion and extends outwards along the surface of the circuit board of the power supply circuit unit; and a power supplying-side standing portion that is bent from the power supplying-side extending portion and extends in a direction away from the circuit board of the power supply circuit unit. The power receiving-side terminal has: a power receiving-side extending portion that is connected to a wiring pattern of the circuit board of the power supply circuit unit and extends outwards along the surface of the circuit board of the power supply circuit unit; and a power receiving-side standing portion that is bent from the power receiving-side extending portion and extends in the direction away from the circuit board of the power supply circuit unit. The power supplying-side standing portion and the power receiving-side standing portion overlap each other, and connected to each other so as to have electrical continuity.

As a preferable electric drive device, each of the power supplying-side terminal and the power receiving-side terminal is formed by a flat plate terminal, and top end portions of the power supplying-side standing portion of the power supplying-side terminal and the power receiving-side standing portion of the power receiving-side terminal are joined together as a welded connecting portion.

As a far preferable electric drive device, the power supplying-side standing portion of the power supplying-side terminal is located at an inner side in the radial direction with respect to the power receiving-side standing portion of the power receiving-side terminal, and the power receiving-side standing portion of the power receiving-side terminal is located at an outer side in the radial direction with respect to the power supplying-side standing portion of the power supplying-side terminal.

As a preferable electric drive device, the power supplying-side standing portion of the power supplying-side terminal extends in the direction away from the circuit board of the power supply circuit unit at a position where the power supplying-side standing portion does not extend outwards over an outer peripheral edge of the circuit board of the power supply circuit unit.

As a far preferable electric drive device, the power receiving-side terminal is placed on a surface of the circuit board where the power supplying-side terminal is located.

As a preferable electric drive device, the power receiving-side terminal is placed on a surface of the circuit board of the power supply circuit unit where the power supplying-side terminal is located.

As a far preferable electric drive device, the power receiving-side extending portion of the power receiving-side terminal is bent, and has a folded shape.

As an electric power steering device based on the above embodiment and modified example, for instance, the followings are raised.

That is, as one aspect of the present invention, an electric power steering device comprises: an electric motor providing a steering assistive force to a steering shaft on the basis of an output from a torque sensor that detects a turning direction and a turning torque of the steering shaft; an aluminum-based metal-made motor housing accommodating therein the electric motor; an electronic control unit provided at an end surface portion side of the motor housing which is an opposite side to an output shaft portion of a rotation shaft of the electric motor, the electronic control unit having a control circuit unit, a power supply circuit unit, a power conversion circuit unit, which are configured to drive the electric motor, and a connector case structured to supply power to the power supply circuit unit; and a metal-made metal cover covering the electronic control unit. A power-conversion-circuit heat releasing section and a power-supply-circuit heat releasing section are formed at the end surface portion of the motor housing, and the power conversion circuit unit is set on the power-conversion-circuit heat releasing section and the power supply circuit unit is set on the power-supply-circuit heat releasing section. The control circuit unit is mounted on a circuit board for the control circuit unit and the power supply circuit unit is mounted on a circuit board for the power supply circuit unit, and each of the circuit boards is set in a radial direction orthogonal to the rotation shaft of the electric motor so as to be stacked in a direction of the rotation shaft of the electric motor. The connector case has a power supplying-side terminal structured to supply power to the power supply circuit unit, and the power supply circuit unit has a power receiving-side terminal structured to receive the power from the power supplying-side terminal for power supply to the power supply circuit unit mounted on the circuit board for the power supply circuit unit. The power supplying-side terminal has: a power supplying-side hanging portion that extends toward a surface of the circuit board of the power supply circuit unit; a power supplying-side extending portion that is bent from the power supplying-side hanging portion and extends outwards along the surface of the circuit board of the power supply circuit unit; and a power supplying-side standing portion that is bent from the power supplying-side extending portion and extends in a direction away from the circuit board of the power supply circuit unit. The power receiving-side terminal has: a power receiving-side extending portion that is connected to a wiring pattern of the circuit board of the power supply circuit unit and extends outwards along the surface of the circuit board of the power supply circuit unit; and a power receiving-side standing portion that is bent from the power receiving-side extending portion and extends in the direction away from the circuit board of the power supply circuit unit. The power supplying-side standing portion and the power receiving-side standing portion overlap each other, and connected to each other so as to have electrical continuity.

As a preferable electric power steering device, each of the power supplying-side terminal and the power receiving-side terminal is formed by a flat plate terminal, and top end portions of the power supplying-side standing portion of the power supplying-side terminal and the power receiving-side standing portion of the power receiving-side terminal are joined together as a welded connecting portion.

As a far preferable electric power steering device, the power supplying-side standing portion of the power supplying-side terminal is located at an inner side in the radial direction with respect to the power receiving-side standing portion of the power receiving-side terminal, and the power receiving-side standing portion of the power receiving-side terminal is located at an outer side in the radial direction with respect to the power supplying-side standing portion of the power supplying-side terminal.

As a far preferable electric power steering device, the power supplying-side standing portion of the power supplying-side terminal extends in the direction away from the circuit board of the power supply circuit unit at a position where the power supplying-side standing portion does not extend outwards over an outer peripheral edge of the circuit board of the power supply circuit unit.

As a far preferable electric power steering device, the power receiving-side terminal is placed on a surface of the circuit board of the power supply circuit unit where the power supplying-side terminal is located.

As a far preferable electric power steering device, the power receiving-side extending portion of the power receiving-side terminal is bent, and has a folded shape.

The invention claimed is:

1. An electric drive device comprising:
    an electric motor driving a mechanical control element; and
    an electronic control device provided at an opposite side to an output shaft of the electric motor and configured to control the electric motor, the electronic control device having:
        a connector case;
        an ECU housing connected to a motor housing that accommodates therein the electric motor;
        an electronic control unit accommodated in the ECU housing and having a circuit board configured to control the electric motor;
        a power supplying-side terminal provided at the connector case and structured to supply power to a circuit unit mounted on the circuit board; and
        a power receiving-side terminal provided at the circuit board and structured to receive the power from the power supplying-side terminal for power supply to the circuit unit of the circuit board, wherein
    the power supplying-side terminal has:
        a power supplying-side hanging portion that extends toward a surface of the circuit board;
        a power supplying-side extending portion that is bent from the power supplying-side hanging portion and extends outwards along the surface of the circuit board; and
        a power supplying-side standing portion that is bent from the power supplying-side extending portion and extends in a direction away from the circuit board,
    the power receiving-side terminal has:
        a power receiving-side extending portion that is connected to a wiring pattern of the circuit board and extends outwards along the surface of the circuit board; and
        a power receiving-side standing portion that is bent from the power receiving-side extending portion and extends in the direction away from the circuit board,
    the power supplying-side terminal and the power receiving-side terminal are arranged so that the power supplying-side extending portion and the power receiving-side extending portion overlap each other when viewed in an axial direction of the electric motor, with the power supplying-side extending portion and the power receiving-side extending portion being separate from each other in the axial direction of the electric motor,
    the power supplying-side standing portion is located at an inner side of the circuit board with respect to the power receiving-side standing portion, and
    the power supplying-side standing portion and the power receiving-side standing portion overlap each other, and are connected to each other so as to have electrical continuity.

2. The electric drive device as claimed in claim 1, wherein:
    each of the power supplying-side terminal and the power receiving-side terminal is formed by a flat plate terminal, and
    top end portions of the power supplying-side standing portion of the power supplying-side terminal and the power receiving-side standing portion of the power receiving-side terminal are joined together as a welded connecting portion.

3. The electric drive device as claimed in claim 2, wherein:
    the power supplying-side standing portion of the power supplying-side terminal is located at an inner side in a radial direction with respect to the power receiving-side standing portion of the power receiving-side terminal, and the power receiving-side standing portion of the power receiving-side terminal is located at an outer side in the radial direction with respect to the power supplying-side standing portion of the power supplying-side terminal.

4. The electric drive device as claimed in claim 3, wherein:
    the power supplying-side standing portion of the power supplying-side terminal extends in the direction away from the circuit board at a position where the power supplying-side standing portion does not extend outwards over an outer peripheral edge of the circuit board.

5. The electric drive device as claimed in claim 1, wherein:

the power receiving-side terminal is placed on a surface, which faces the power supplying-side terminal, of the circuit board.

6. The electric drive device as claimed in claim 5, wherein:
the power receiving-side extending portion of the power receiving-side terminal is bent, and has a folded shape.

7. The electric power steering device as claimed in claim 1, wherein:
the power supplying-side extending portion and the power receiving-side extending portion overlap each other at an inner side of the circuit board when viewed in the axial direction of the electric motor.

8. An electric drive device comprising:
a motor housing accommodating therein an electric motor that drives a mechanical control element; and
an electronic control unit provided at an end surface portion side of the motor housing which is an opposite side to an output shaft portion of a rotation shaft of the electric motor, the electronic control unit having a control circuit unit, a power supply circuit unit, a power conversion circuit unit, which are configured to drive the electric motor, and a connector case to which a power supply is connected for power supply to the power supply circuit unit, wherein
a power-conversion-circuit heat releasing section and a power-supply-circuit heat releasing section are formed at the end surface portion of the motor housing, and the power conversion circuit unit is set on the power-conversion-circuit heat releasing section and the power supply circuit unit is set on the power-supply-circuit heat releasing section,
the control circuit unit is mounted on a circuit board for the control circuit unit and the power supply circuit unit is mounted on a circuit board for the power supply circuit unit, and each of the circuit boards is set in a radial direction orthogonal to the rotation shaft of the electric motor so as to be stacked in a direction of the rotation shaft of the electric motor,
the connector case has a power supplying-side terminal structured to supply power to the power supply circuit unit, and the power supply circuit unit has a power receiving-side terminal structured to receive the power from the power supplying-side terminal for power supply to the power supply circuit unit mounted on the circuit board for the power supply circuit unit,
the power supplying-side terminal has:
a power supplying-side hanging portion that extends toward a surface of the circuit board of the power supply circuit unit;
a power supplying-side extending portion that is bent from the power supplying-side hanging portion and extends outwards along the surface of the circuit board of the power supply circuit unit; and
a power supplying-side standing portion that is bent from the power supplying-side extending portion and extends in a direction away from the circuit board of the power supply circuit unit,
the power receiving-side terminal has:
a power receiving-side extending portion that is connected to a wiring pattern of the circuit board of the power supply circuit unit and extends outwards along the surface of the circuit board of the power supply circuit unit; and
a power receiving-side standing portion that is bent from the power receiving-side extending portion and extends in the direction away from the circuit board of the power supply circuit unit,
the power supplying-side terminal and the power receiving-side terminal are arranged so that the power supplying-side extending portion and the power receiving-side extending portion overlap each other when viewed in an axial direction of the electric motor, with the power supplying-side extending portion and the power receiving-side extending portion being separate from each other in the axial direction of the electric motor, and
the power supplying-side standing portion and the power receiving-side standing portion overlap each other, and are connected to each other so as to have electrical continuity.

9. The electric drive device as claimed in claim 8, wherein:
each of the power supplying-side terminal and the power receiving-side terminal is formed by a flat plate terminal, and
top end portions of the power supplying-side standing portion of the power supplying-side terminal and the power receiving-side standing portion of the power receiving-side terminal are joined together as a welded connecting portion.

10. The electric drive device as claimed in claim 9, wherein:
the power supplying-side standing portion of the power supplying-side terminal is located at an inner side in the radial direction with respect to the power receiving-side standing portion of the power receiving-side terminal, and the power receiving-side standing portion of the power receiving-side terminal is located at an outer side in the radial direction with respect to the power supplying-side standing portion of the power supplying-side terminal.

11. The electric drive device as claimed in claim 10, wherein:
the power supplying-side standing portion of the power supplying-side terminal extends in the direction away from the circuit board of the power supply circuit unit at a position where the power supplying-side standing portion does not extend outwards over an outer peripheral edge of the circuit board of the power supply circuit unit.

12. The electric drive device as claimed in claim 8, wherein:
the power receiving-side terminal is placed on a surface, which faces the power supplying-side terminal, of the circuit board of the power supply circuit unit.

13. The electric drive device as claimed in claim 12, wherein:
the power receiving-side extending portion of the power receiving-side terminal is bent, and has a folded shape.

14. The electric power steering device as claimed in claim 8, wherein:
the power supplying-side extending portion and the power receiving-side extending portion overlap each other at an inner side of the circuit board when viewed in the axial direction of the electric motor.

15. An electric power steering device comprising:
an electric motor providing a steering assistive force to a steering shaft on the basis of an output from a torque sensor that detects a turning direction and a turning torque of the steering shaft;
an aluminum-based metal-made motor housing accommodating therein the electric motor;

an electronic control unit provided at an end surface portion side of the motor housing which is an opposite side to an output shaft portion of a rotation shaft of the electric motor, the electronic control unit having a control circuit unit, a power supply circuit unit, and a power conversion circuit unit, which are configured to drive the electric motor, and a connector case to which a power supply is connected for power supply to the power supply circuit unit; and a metal-made metal cover covering the electronic control unit, wherein a power-conversion-circuit heat releasing section and a power-supply-circuit heat releasing section are formed at the end surface portion of the motor housing, and the power conversion circuit unit is set on the power-conversion-circuit heat releasing section and the power supply circuit unit is set on the power-supply-circuit heat releasing section, the control circuit unit is mounted on a circuit board for the control circuit unit and the power supply circuit unit is mounted on a circuit board for the power supply circuit unit, and each of the circuit boards is set in a radial direction orthogonal to the rotation shaft of the electric motor so as to be stacked in a direction of the rotation shaft of the electric motor, the connector case has a power supplying-side terminal structured to supply power to the power supply circuit unit, and the power supply circuit unit has a power receiving-side terminal structured to receive the power from the power supplying-side terminal for power supply to the power supply circuit unit mounted on the circuit board for the power supply circuit unit, the power supplying-side terminal has:
- a power supplying-side hanging portion that extends toward a surface of the circuit board of the power supply circuit unit;
- a power supplying-side extending portion that is bent from the power supplying-side hanging portion and extends outwards along the surface of the circuit board of the power supply circuit unit; and
- a power supplying-side standing portion that is bent from the power supplying-side extending portion and extends in a direction away from the circuit board of the power supply circuit unit, the power receiving-side terminal has:
- a power receiving-side extending portion that is connected to a wiring pattern of the circuit board of the power supply circuit unit and extends outwards along the surface of the circuit board of the power supply circuit unit; and
- a power receiving-side standing portion that is bent from the power receiving-side extending portion and extends in the direction away from the circuit board of the power supply circuit unit, the power supplying-side terminal and the power receiving-side terminal are arranged so that the power supplying-side extending portion and the power receiving-side extending portion overlap each other when viewed in an axial direction of the electric motor, with the power supplying-side extending portion and the power receiving-side extending portion being separate from each other in the axial direction of the electric motor, and the power supplying-side standing portion and the power receiving-side standing portion overlap each other, and connected to each other so as to have electrical continuity.

16. The electric power steering device as claimed in claim 15, wherein:
each of the power supplying-side terminal and the power receiving-side terminal is formed by a flat plate terminal, and
top end portions of the power supplying-side standing portion of the power supplying-side terminal and the power receiving-side standing portion of the power receiving-side terminal are joined together as a welded connecting portion.

17. The electric power steering device as claimed in claim 16, wherein:
the power supplying-side standing portion of the power supplying-side terminal is located at an inner side in the radial direction with respect to the power receiving-side standing portion of the power receiving-side terminal, and the power receiving-side standing portion of the power receiving-side terminal is located at an outer side in the radial direction with respect to the power supplying-side standing portion of the power supplying-side terminal.

18. The electric power steering device as claimed in claim 17, wherein:
the power supplying-side standing portion of the power supplying-side terminal extends in the direction away from the circuit board of the power supply circuit unit at a position where the power supplying-side standing portion does not extend outwards over an outer peripheral edge of the circuit board of the power supply circuit unit.

19. The electric power steering device as claimed in claim 18, wherein:
the power receiving-side terminal is placed on a surface, which faces the power supplying-side terminal, of the circuit board of the power supply circuit unit.

20. The electric power steering device as claimed in claim 19, wherein:
the power receiving-side extending portion of the power receiving-side terminal is bent, and has a folded shape.

21. The electric power steering device as claimed in claim 15, wherein:
the power supplying-side extending portion and the power receiving-side extending portion overlap each other at an inner side of the circuit board when viewed in the axial direction of the electric motor.

* * * * *